US011266036B2

(12) United States Patent  
Klaner et al.

(10) Patent No.: US 11,266,036 B2  
(45) Date of Patent: Mar. 1, 2022

(54) ASSEMBLY FORMED FROM A SWITCH CABINET BASE AND A SWITCH CABINET RACK MOUNTED THEREON, AND A CORRESPONDING SWITCH CABINET ROW

(71) Applicant: RITTAL GMBH & CO. KG, Herborn (DE)

(72) Inventors: Thomas Klaner, Kirchhain (DE); Jason Tom, Mechanicsburg, OH (US); Glenn Byrne, Dayton, OH (US)

(73) Assignee: RITTAL GMBH & CO. KG

( * ) Notice: Subject to any disclaimer, the term of this patent is extended or adjusted under 35 U.S.C. 154(b) by 96 days.

(21) Appl. No.: 16/622,625

(22) PCT Filed: Apr. 19, 2018

(86) PCT No.: PCT/DE2018/100375  
§ 371 (c)(1),  
(2) Date: Dec. 13, 2019

(87) PCT Pub. No.: WO2019/001610  
PCT Pub. Date: Jan. 3, 2019

(65) Prior Publication Data  
US 2021/0153378 A1 May 20, 2021

(30) Foreign Application Priority Data  
Jun. 28, 2017 (DE) .................. 10 2017 114 389.0

(51) Int. Cl.  
*H05K 7/00* (2006.01)  
*H05K 7/18* (2006.01)  
(Continued)

(52) U.S. Cl.  
CPC ........... *H05K 7/183* (2013.01); *A47B 91/005* (2013.01); *H02B 1/301* (2013.01); *H02B 1/303* (2013.01); *H02B 1/32* (2013.01)

(58) Field of Classification Search  
CPC ...... H05K 7/183; A47B 91/005; H02B 1/301; H02B 1/303; H02B 1/32; A47G 1/1653;  
(Continued)

(56) References Cited

U.S. PATENT DOCUMENTS 4,106,630 A * 8/1978 Rosenband ............ A47B 57/22  
211/191  
4,650,262 A 3/1987 Debus et al.  
(Continued)

FOREIGN PATENT DOCUMENTS

CN 1238066 A 12/1999  
DE 4103678 * 3/1992  
(Continued)

OTHER PUBLICATIONS

International Search Report (in English and German) and Written Opinion (in German) issued in PCT/DE2018/100375, dated Jun. 29, 2018; ISA/EP.

(Continued)

*Primary Examiner* — Janet M Wilkens  
(74) *Attorney, Agent, or Firm* — Harness, Dickey & Pierce, P.L.C.

(57) ABSTRACT

An arrangement of a switch cabinet base and a switch cabinet frame rack mounted thereon, wherein the switch cabinet base includes a plurality of base corner pieces fixed to the switch cabinet frame rack, and the switch cabinet frame rack including a plurality of profile struts, at least one profile strut of which includes a first mounting side with a row of holes of first mounting receptacles, and wherein at least one of the base corner pieces has a second mounting side with a row of holes of second mounting receptacles, wherein the first and second mounting receptacles are spaced apart by the same grid dimension.

30 Claims, 16 Drawing Sheets

(51) Int. Cl.
*A47B 91/00* (2006.01)
*H02B 1/30* (2006.01)
*H02B 1/32* (2006.01)

(58) Field of Classification Search
CPC ............. Y10T 403/4602; Y10T 403/42; Y10T 403/73
USPC ....... 312/265.1–265.4, 257.1, 107, 108, 111; 248/220.1
See application file for complete search history.

(56) References Cited

U.S. PATENT DOCUMENTS

| | | | |
|---|---|---|---|
| 5,498,073 A * | 3/1996 | Charbonneau | H02B 1/01 312/257.1 |
| 9,271,424 B2 * | 2/2016 | Broemstrup | H02B 1/303 |
| 9,726,208 B1 * | 8/2017 | Roberts | A47C 23/005 |
| 10,938,190 B1 * | 3/2021 | Goelst | H02B 1/54 |
| 2017/0290426 A1 * | 10/2017 | Hovenden | F16B 12/02 |

FOREIGN PATENT DOCUMENTS

| | | | |
|---|---|---|---|
| DE | 4409031 | * | 9/1995 |
| DE | 19647727 A1 | | 5/1998 |
| DE | 19860408 | * | 7/2000 |
| DE | 19860406 | * | 10/2000 |
| DE | 102011013158 A1 | | 8/2012 |
| DE | 102015121193 A1 | | 6/2017 |
| EP | 0158216 A2 | | 10/1985 |
| EP | 342478 | * | 11/1989 |
| EP | 0725464 | * | 8/1996 |
| EP | 940067 | * | 5/2000 |
| WO | 03030322 | * | 4/2003 |
| WO | 2005002013 | * | 1/2005 |

OTHER PUBLICATIONS

U.S. Appl. No. 16/622,577, filed Dec. 13, 2019, Schindler et al.

* cited by examiner

ASSEMBLY FORMED FROM A SWITCH CABINET BASE AND A SWITCH CABINET RACK MOUNTED THEREON, AND A CORRESPONDING SWITCH CABINET ROW

CROSS-REFERENCE TO RELATED APPLICATIONS

This application is a 371 U.S. National Phase of International Application No. PCT/DE2018/100375, filed on Apr. 19, 2018, which claims the benefit of German Application No. 10 2017 114 389.0, filed on Jun. 28, 2017. The entire disclosures of the above applications are incorporated herein by reference.

BACKGROUND

This section provides background information related to the present disclosure which is not necessarily prior art.

TECHNICAL FIELD

The invention relates to an Arrangement of a switch cabinet base and a switch cabinet frame rack mounted thereon, wherein the switch cabinet base comprises a plurality of base corner pieces fixed to the switch cabinet frame rack, and the switch cabinet frame rack comprises a plurality of profile struts, at least one profile strut of which comprises a first mounting side with a row of holes of first mounting receptacles, and wherein at least one of the base corner pieces comprises a second mounting side with a row of holes of second mounting receptacles. Such an arrangement is known from DE 10 2015 121 193 A1.

Discussion

Regarding switch cabinet installation, it is generally desirable to arrange the components to be accommodated in the switch cabinet as space-savingly as possible, whereby the arrangement of the components in the interior of the switch cabinet can still be restricted by other boundary conditions, such as cable or air conditioning management. There is therefore a fundamental need for a switch cabinet interior comprising a highly flexible switch cabinet installation concept for adapting to the strongly varying requirements of different implementations.

SUMMARY

This section provides a general summary of the disclosure, and is not a comprehensive disclosure of its full scope or all of its features.

It is therefore the aspect of the invention to offer an arrangement of the type described above that provides a flexible interior installation concept.

Accordingly, it is provided that the first and second mounting receptacles are spaced apart by the same grid dimension.

The invention is thus based on the general idea of making the space hitherto mostly unused for the interior switch cabinet installation, which space is enclosed by the switch cabinet base, usable for the arrangement of switch cabinet installation components. Since the second mounting receptacles are arranged under the same grid dimension as the first mounting receptacles, the components previously used only in the interior installation of the switch cabinet frame rack can also be used in the installation of the switch cabinet base.

It is conceivable, for example, that the bottom sheets used in switch cabinet arrangements known from the art, which bottom sheets close off the volume enclosed by the frame rack at the base, could be omitted, so that effectively the volume enclosed by the switch cabinet base expands the volume enclosed by the switch cabinet frame rack towards the bottom, so that additional installation space is provided for the interior switch cabinet installation. It is also conceivable that the aforementioned bottom sheets may only be partially removed or omitted, depending on whether an interior installation component is to be guided between the volume enclosed by the frame rack and the base volume at the respective position.

In particular, it is conceivable that at least one interior installation component, for example a mounting chassis or the like, is guided between the switch cabinet interior enclosed by the switch cabinet frame rack and the base space enclosed by the switch cabinet base. The interior installation component can be fixed with a first end in the switch cabinet interior enclosed by the frame rack and with a second end opposite the first end in the space enclosed by the switch cabinet base. Suitable interior installation components, such as mounting chassis, are known from the art.

It is advantageous when the first mounting receptacles and the second mounting receptacles not only adhere to the grid dimension with their own row of holes, but also when the entirety of the first and second mounting receptacles are arranged under the same grid dimension. This can be achieved by arranging each a first mounting receptacle and a second mounting receptacle at a distance spaced apart from each other by the grid dimension or an integer multiple of the grid dimension. Furthermore, the two rows of holes can be arranged in the same plane so that the two rows of holes have a common mounting plane.

The first and second mounting side may be arranged in the same plane. Similarly, the first mounting receptacles may form a first system perforation of mounting receptacles regularly spaced apart by the grid dimension and the second mounting receptacles may form a second system perforation of mounting receptacles regularly spaced apart by the grid dimension. The first and second mounting receptacles can be spaced apart from each other while maintaining the grid dimension or an integer multiple of the grid dimension.

When the assembly comprises an interior installation component, it may be fixed with a first fastening section in a volume enclosed by the switch cabinet frame rack and with a second fastening section in a volume enclosed by the switch cabinet base.

Alternatively, the interior installation component may be mounted with a first fastening section via one of the first mounting receptacles on the first mounting side of the profile strut, wherein the interior installation component is fixed with a second fastening section via one of the second mounting receptacles on the second mounting side of the base corner piece.

Alternatively, the interior installation component may be fixed with a first fastening section via one of the second mounting receptacles to the second mounting side of the base corner piece, while the interior installation component may be fixed with a second fastening section via one of the second mounting receptacles to the second mounting side of another of the base corner pieces. The two rows of holes of the second mounting receptacles of the corner pieces can have a distance to each other which corresponds to an integer multiple of the grid dimension.

The interior installation component can be, for example, a mounting chassis, a hollow rail, a cable catch rail, but is not limited to these.

The first fastening section of the interior installation component may have a first fastening means and the second fastening section of the interior installation component may have a second fastening means, the distance between the fastening means being an integer multiple of the grid dimension.

Two of the base corner pieces of the switch cabinet base can each be arranged facing each other with an outer wall, wherein the outer walls each comprise the second mounting side with the second mounting receptacles. The outer walls can be arranged at a distance from each other that corresponds to an integer multiple of the grid dimension.

The base corner piece can be a shaped part, in particular a sheet metal shaped part, with a first and a second outer wall which extend perpendicular to each other. The shaped part can also have an upper cover side and a lower bottom side, which are arranged parallel to each other and perpendicular to the outer walls. The outer walls, cover and bottom sides may delimit an interior space of the base corner piece which is open towards a corner of the shaped part.

The base corner piece may have an inlay, in particular a plastic inlay, which extends in the interior space between the cover side and the bottom side and which at its end in front of the cover side has a receptacle which is open towards the cover side, in which receptacle a threaded nut, in particular a K-Lock nut, is accommodated in a rotation-proof manner.

With the base corner piece, it can be ensured that the mechanical support of the base corner piece for the switch cabinet frame rack is provided by the shaped part, while functionalities requiring less mechanical load, such as the rotation-proof arrangement of a threaded nut inside the shaped part for mounting the shaped part on the underside of a switch cabinet frame rack, are provided by the inlay, which can in particular be formed as a plastic inlay. Depending on the embodiment, the inlay can provide additional functions, such as fastening means for mounting a base panel to the base corner piece. The inlay is preferably an optional component which is configured to provide the shaped part with additional functions as required.

The shaped part and the inlay can in particular be provided as separate parts, so that the inlay can be omitted for embodiments in which the additional functions provided by the inlay are not required. In particular, the inlay can be releasably connected to the shaped part in a mounting position in the interior space, in particular it can be latched to it or held on it by a positive fit.

The inlay can be arranged in the interior space of the base corner piece such that a threaded passage of the threaded nut is aligned with an opening through the cover side so that the threaded passage is accessible from an outer side of the base corner piece, e.g. for mounting the base corner piece in the corner area and on the underside of a switch cabinet frame rack.

The cover side can have a trough-shaped recess for the positive reception of a sliding skid, wherein an opening through the cover side is arranged in the recess, which is aligned with a threaded passage of the threaded nut. The sliding skid can be pre-mounted on the underside of a switch cabinet frame rack, so that when the switch cabinet frame rack is placed on one of four base corner pieces of the type described above, wherein the base corner pieces are connected, for example, via four base panels to form a rectangular switch cabinet base, the sliding skids enable simple and precise pre-positioning of the switch cabinet frame rack in relation to the switch cabinet base, so that, for example, a through hole in a corner piece of the base frame of the switch cabinet frame rack is aligned with the threaded passage of the threaded nut of the base corner piece, so that the switch cabinet frame rack can be screwed to the switch cabinet base without time-consuming alignment procedures. A suitable frame rack is known from DE 10 2015 121 193 A1.

The outer walls may each have an U-edging at their free longitudinal edge, with a first profile side extending perpendicularly to the outer wall and a second profile side formed on the first profile side, which extends parallel to the outer wall and has a free edge arranged in the interior space. The U-edging can provide further functionality, for example a system perforation with regularly spaced mounting receptacles that can be used, for example, for installation in the switch cabinet base. However, the U-edging can also be configured in particular to enable the fixing of base panels on the base corner piece.

For example, on at least one of the first and second profile sides, the U-edgings can have a system perforation running in the vertical direction of mounting openings spaced apart by a grid dimension, wherein a frame rack for a switch cabinet is placed on the base corner piece, preferably via a sliding skid, the frame rack having a profile strut with a further profile side which is arranged in the same plane as the profile side of the U-edging which has the system perforation, and wherein a system perforation of the further profile side is arranged relative to the system perforation of the U-edging while adhering to the grid dimension.

By adhering to the grid dimension specified by the switch cabinet frame rack through into the base area, the switch cabinet interior enclosed by the switch cabinet frame rack can be extended by the space enclosed by the switch cabinet base in one embodiment of the invention, wherein, for example, the mounting chassis and the like can be guided between the switch cabinet base and the switch cabinet interior through into the switch cabinet base due to the continuity of the grid dimension, without the need for adapters or other adaptation measures.

The inlay may have a first pair of guide pins and a second pair of guide pins spaced apart, the first pair of guide pins with its free ends abutting the second profile side of a first one of the two U-edgings, and wherein the second pair of guide pins with its free ends abutting the second profile side of a second of the U-edgings.

The inlay may also have a first and a second fastening means, in particular a first and a second pair of latching pawls which can be pre-tensioned against each other, and which extends with its free end between one of the pairs of guide pins each towards and parallel to the respective second profile side.

In particular, a base panel can engage around one of the two U-edgings with a fastening tab, wherein a free end of the fastening tab extends perpendicularly to the panel front, abuts against the second profile side of one of the U-edgings and is preferably fixed to the second profile side.

The free end of the fastening tab can have an undercut clearance on an edge facing the interior space, in which undercut clearance a fastening means of the inlay, in particular a pair of latching pawls, engages.

The interior space of the base corner piece can be closed off by a corner panel which abuts parallel to the first profile sides of the U-edgings and engages one of the two free edges of each of the two second profile sides with a latching hook.

In particular, the two first profile sides of the U-edgings and the two second profile sides of the U-edgings can be aligned perpendicular to each other.

The entire shaped part can be formed as a folded, and optionally in overlap areas welded, sheet metal shaped part, wherein the U-edgings can be formed as double folded edges at an outer longitudinal edge of the respective outer wall.

The outer walls can be connected to each other via a connecting side of the shaped part, wherein the connecting side has a polygonal aperture into which the inlay engages with a positive locking adapter formed on its rear side and facing the connecting side. The inlay can alternatively or additionally have a further positive locking adapter at its end facing the cover side, at which also the receptacle for the threaded nut is arranged, which further positive locking adapter engages in a recess in the cover side. Instead of the further positive locking adapter, at least one crimp rib can also be formed at the upper or lower end of the inlay, which can be used to clamp the inlay between the cover side and the bottom side in a press fit. In particular, the positive locking adapters ensure that the inlay is held in the shaped part in a rotation-proof manner.

When the outer walls extend perpendicular to each other, the connecting side can extend at an angle of 45° to the two outer walls. The connecting side may have a width which determines the distance between the outer walls, which width is substantially less than a length of the connecting side perpendicular to the cover side and the bottom side. The connecting side may have a perforation extending in the vertical direction, i.e. in the connecting direction between the cover side and the bottom side, of regularly spaced mounting receptacles.

A threaded bolt can extend between the cover side and the bottom side as well as through the cover side, with a levelling sleeve screwed onto the threaded bolt and arranged between the cover side and the bottom side and on which a levelling base is formed which extends through the bottom side.

On the bottom side of the shaped part, a transport roller can be fixed which can be swivelled between a transport position and a storage position, wherein, in the storage position, a support plane of the transport roller lies in or above a support plane of the base corner piece and wherein, in the transport position, the support plane of the transport roller lies below the support plane of the base corner piece.

A base panel of the switch cabinet base can have a second U-edging on opposite longitudinal edges each, wherein the second U-edgings have a free mounting side each. The free mounting sides can be arranged on a rear side of the base panel parallel to a front side of the base panel and in a common plane. The free mounting sides can each have a row of holes of further mounting receptacles, wherein the rows of holes run parallel to each other and preferably have a distance to each other that corresponds to an integer multiple of the grid dimension. Also the further mounting receptacles forming the rows of holes on the free mounting sides can adhere to a distance between each other which corresponds to the grid dimension.

The switch cabinet base can have second base panels which are arranged opposite each other with their second U-edgings facing each other. A bottom sheet may be fixed to and extending between the two base panels via a pair of opposing free mounting sides of the second U-edgings of the two base panels, wherein preferably a support and a fastening plane for the bottom sheet are provided via a fastening bracket fixed to the base panels.

A base panel of the switch cabinet base can be an anti-tilt protection for the assembly by mounting the base panel between adjacent base corner pieces in a horizontal orientation, in which the base panel rests with its front or rear side on a support on which the assembly rests and with a longitudinal edge projects beyond the clear outer dimension of the frame rack and any flat parts optionally mounted thereon.

A switch cabinet row consists of at least two of the arrangements of the type described above, in which two pairs of facing base corner pieces of adjacent switch cabinet bases, arranged at a distance from each other in the depth direction of the switch cabinet row, are connected to each other via a first base panel running in depth direction.

The first base panel can be aligned horizontally and its front can face the support on which the switch cabinet row stands.

The switch cabinet row may have a second base panel identical to the first base panel, which is vertically aligned and extends between two base corner pieces of the same switch cabinet base. In particular, it may be provided that the base panels used for the switch cabinet row are formed as identical parts to the base panels concealing the switch cabinet base.

The first base panel may have a second U-edging each along its two longitudinal edges with a free mounting side each, which runs parallel to the front side at a distance from a front side of the base panel at a rear side of the base panel and has a row of holes of further mounting receptacles in its direction of extension. The further mounting receptacles can be spaced apart from each other in adherence to the grid dimension. Furthermore, the two rows of holes can run parallel to each other and have a distance to each other that corresponds to an integer multiple of the grid dimension.

The first and second base panels may be identically formed and may have a second U-edging each along their two longitudinal edges, wherein in each case a mounting flange is formed on the second U-edgings which extends perpendicularly to all three sides of the second U-edging. The mounting flange may have at least one fastening means via which the base panel can be fixed to a base corner piece. In particular, it may be provided that both the first base panel for the switch cabinet row and the second base panel for the switch cabinet base panel are each fixed via their mounting flange to one of the base corner pieces, for example also to the same base corner piece, but to outer sides of the base corner piece which are offset by 90° to each other.

One of the switch cabinet bases of the switch cabinet row may have a first base panel on opposite sides each, the base panels each having a row of system perforations on mutually facing longitudinal edges which run parallel to one another and are spaced apart by a distance corresponding to an integral multiple of the grid dimension. An interior installation component, such as a cable catch rail or a mounting chassis, can extend between the longitudinal edges and be fixed to the rows of system perforations with opposing fastening sections. In particular, the rows of system perforations can each be formed in a free mounting side of a second U-edging on a longitudinal side of the respective base panel.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Further details of the invention are explained using the figures below. Where:

Figure 7:
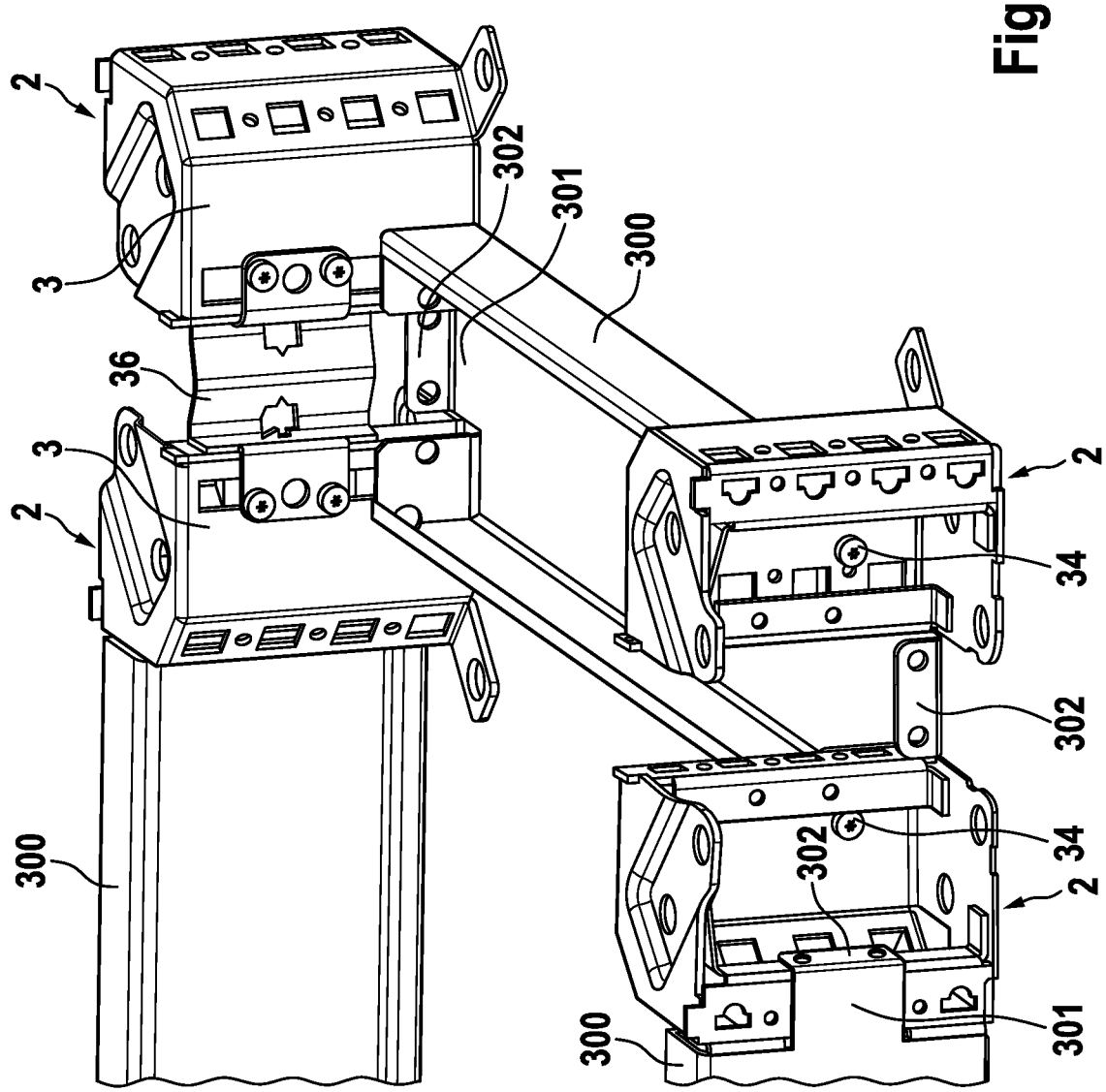
Figure 8:
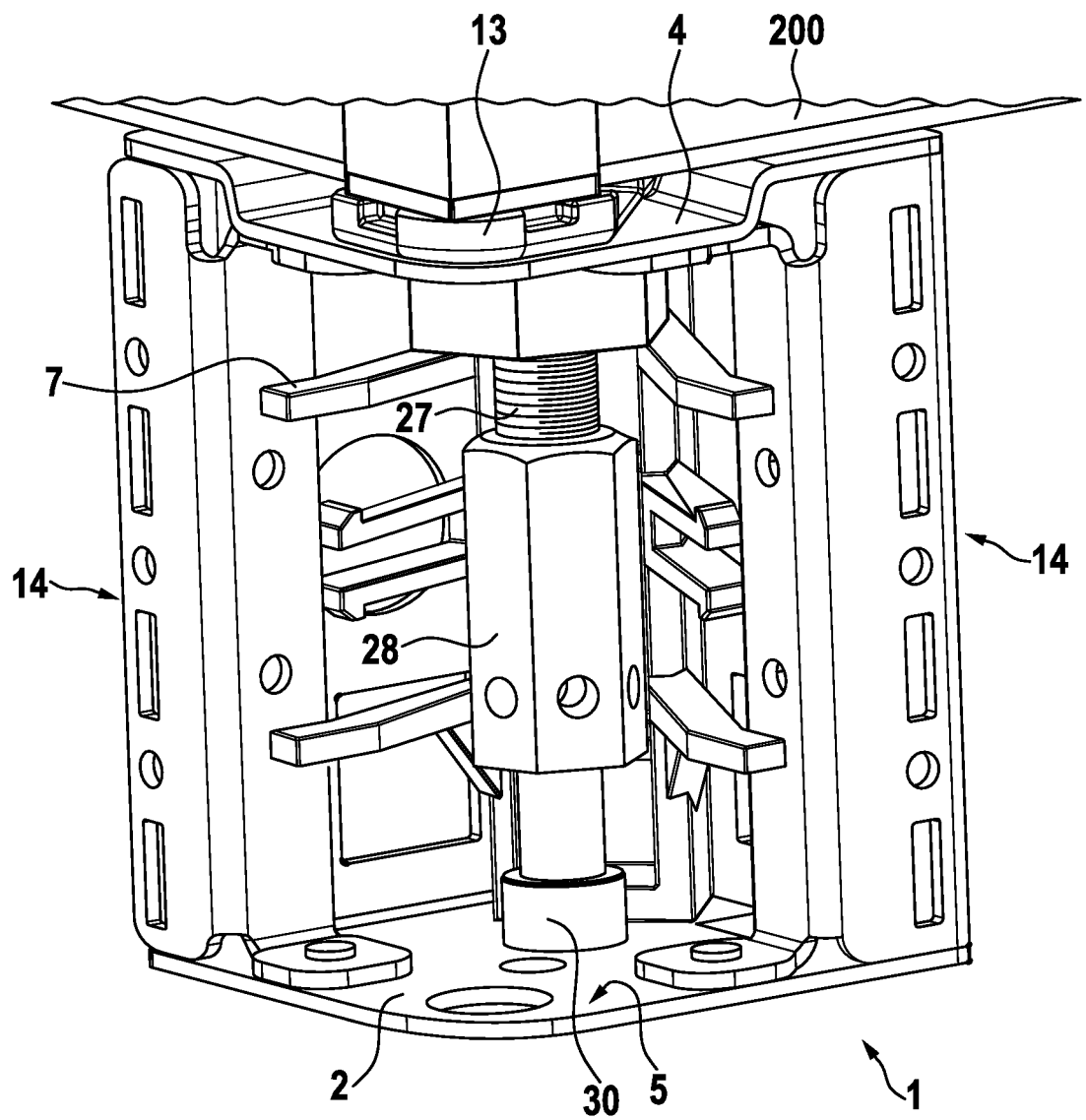
Figure 9:
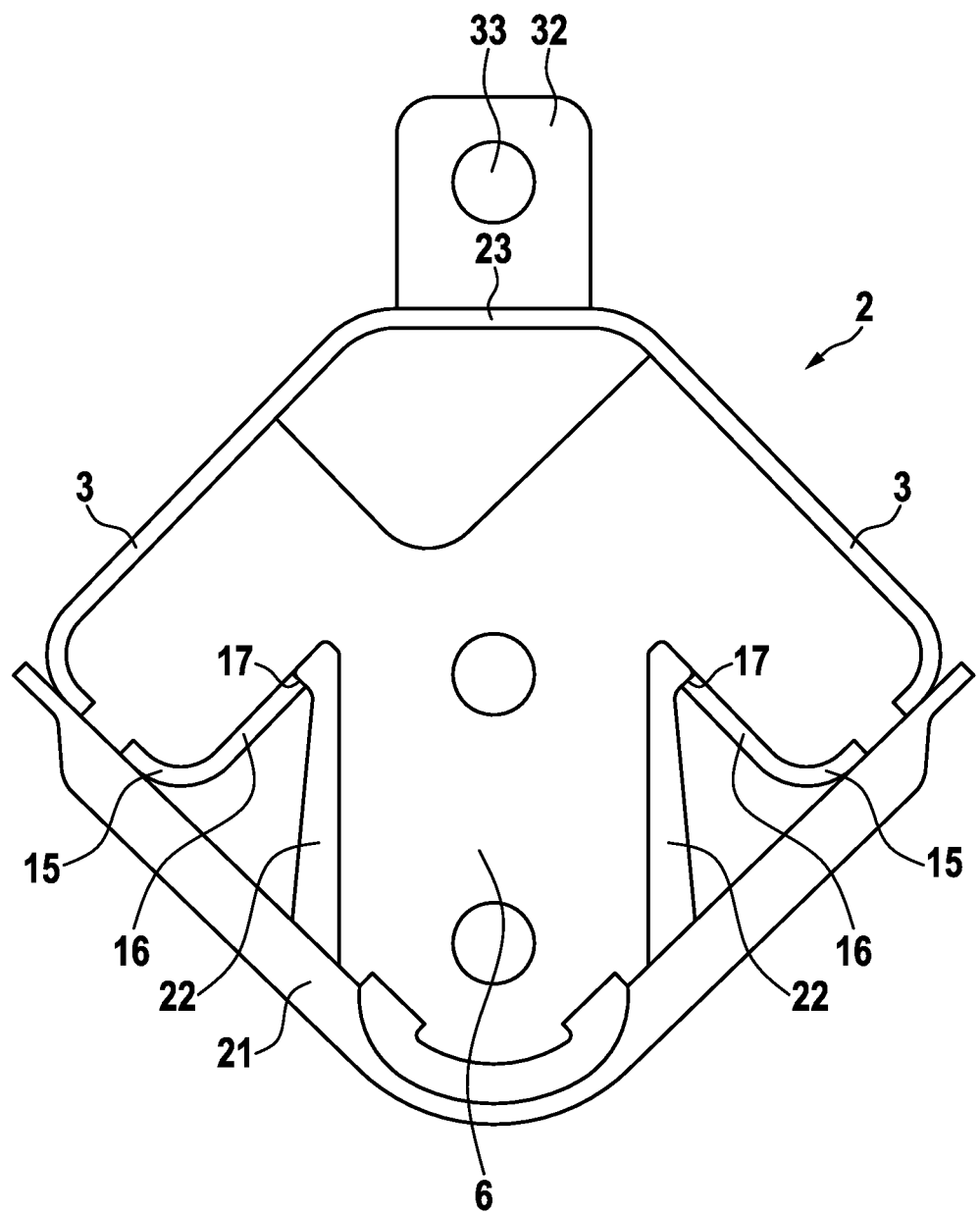
Figure 10:
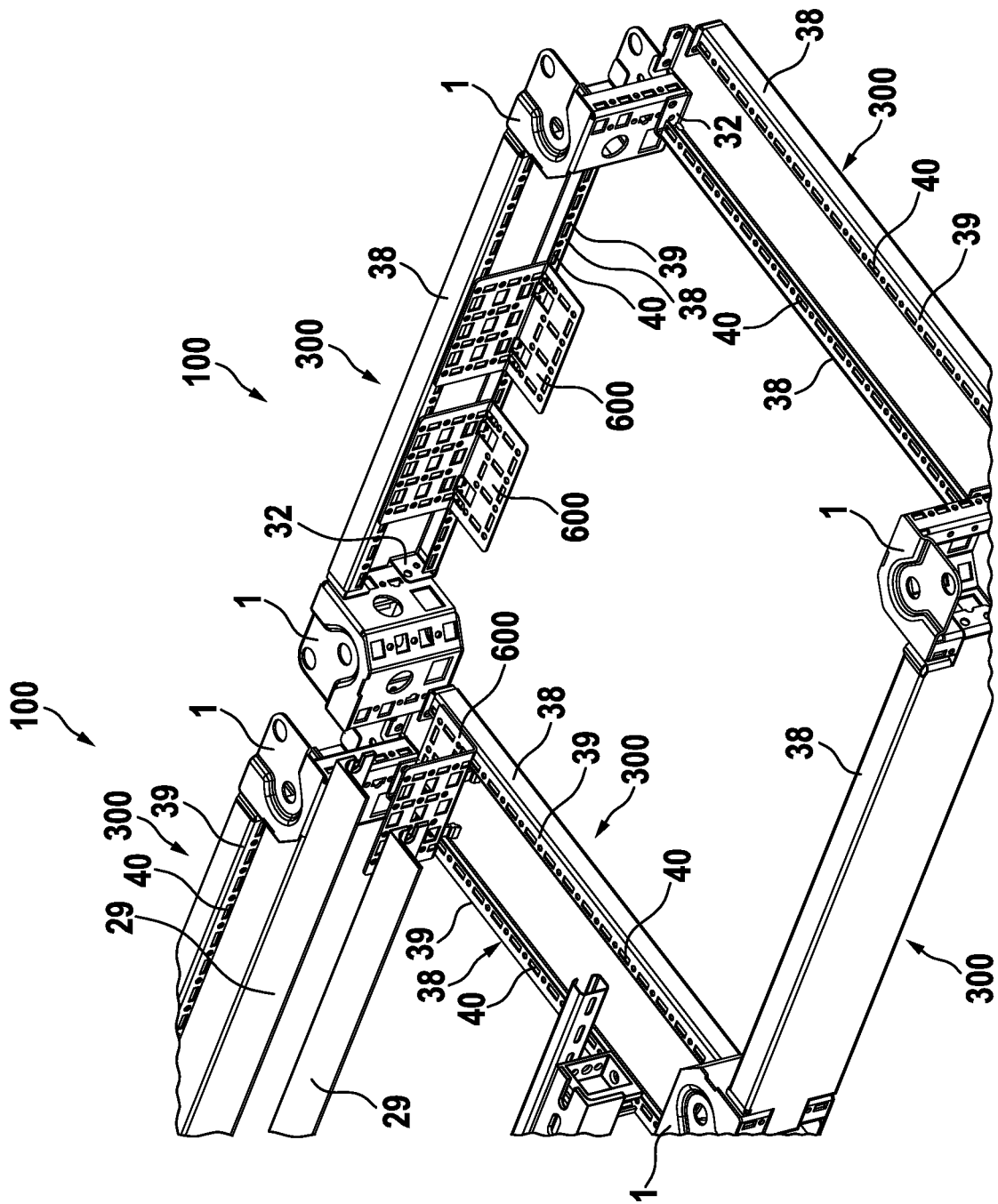
Figure 11:
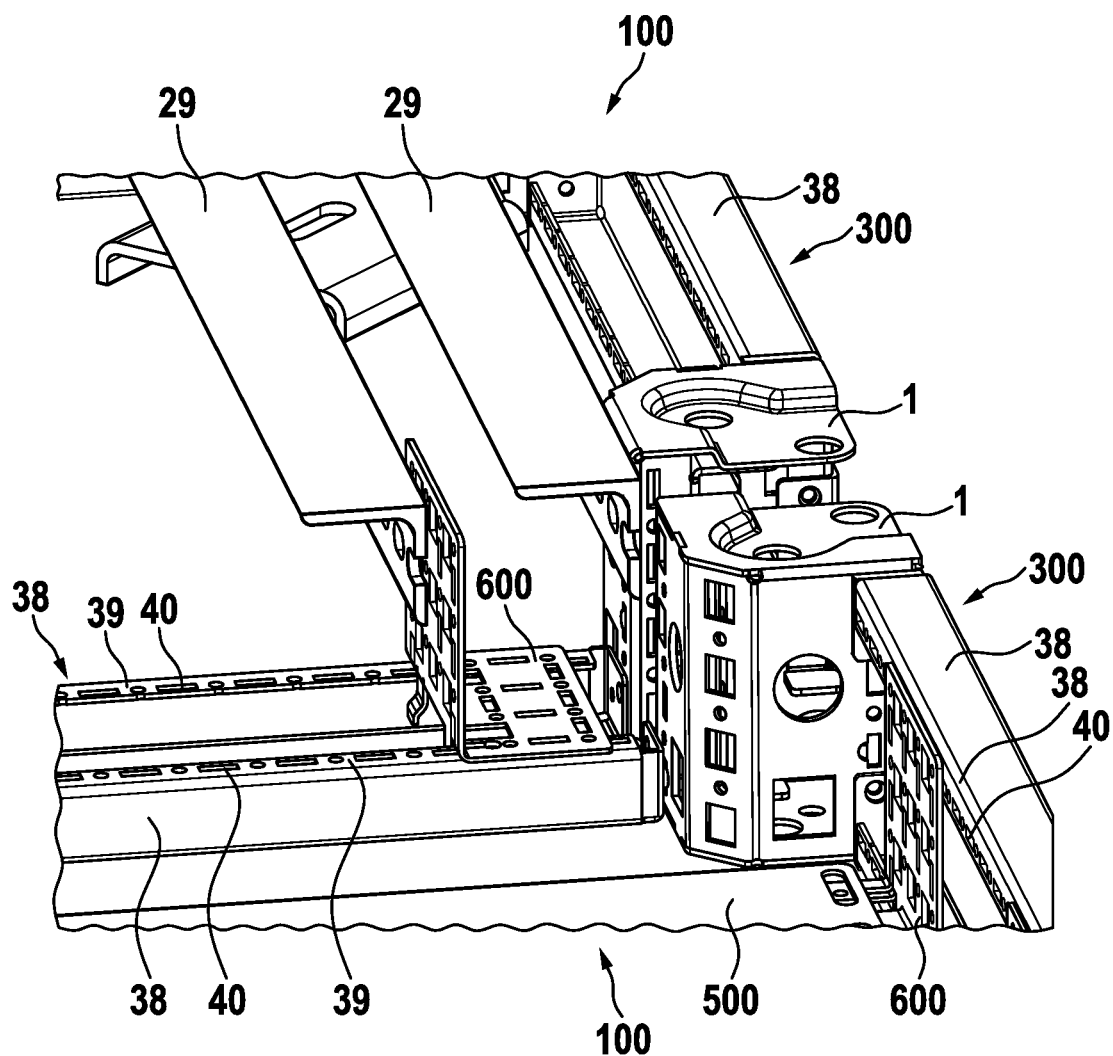
Figure 12:
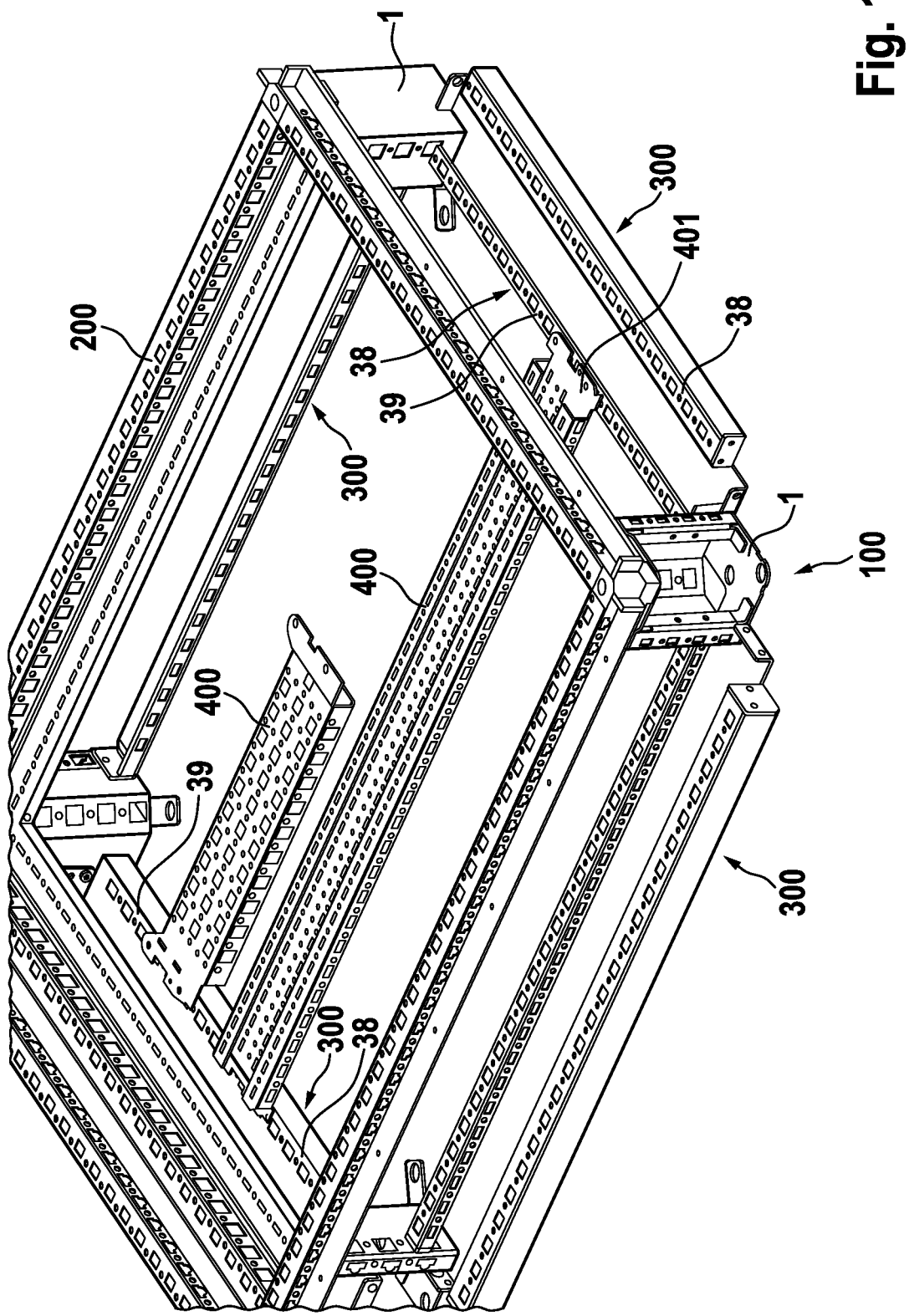
Figure 13:
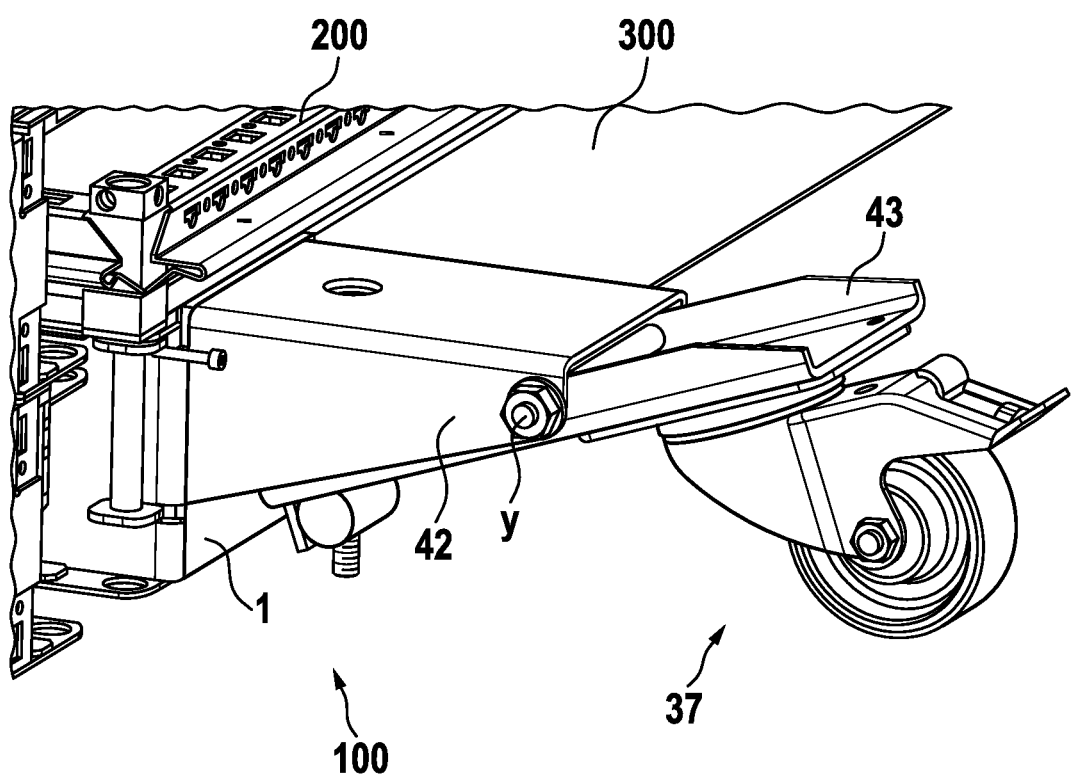
Figure 14:
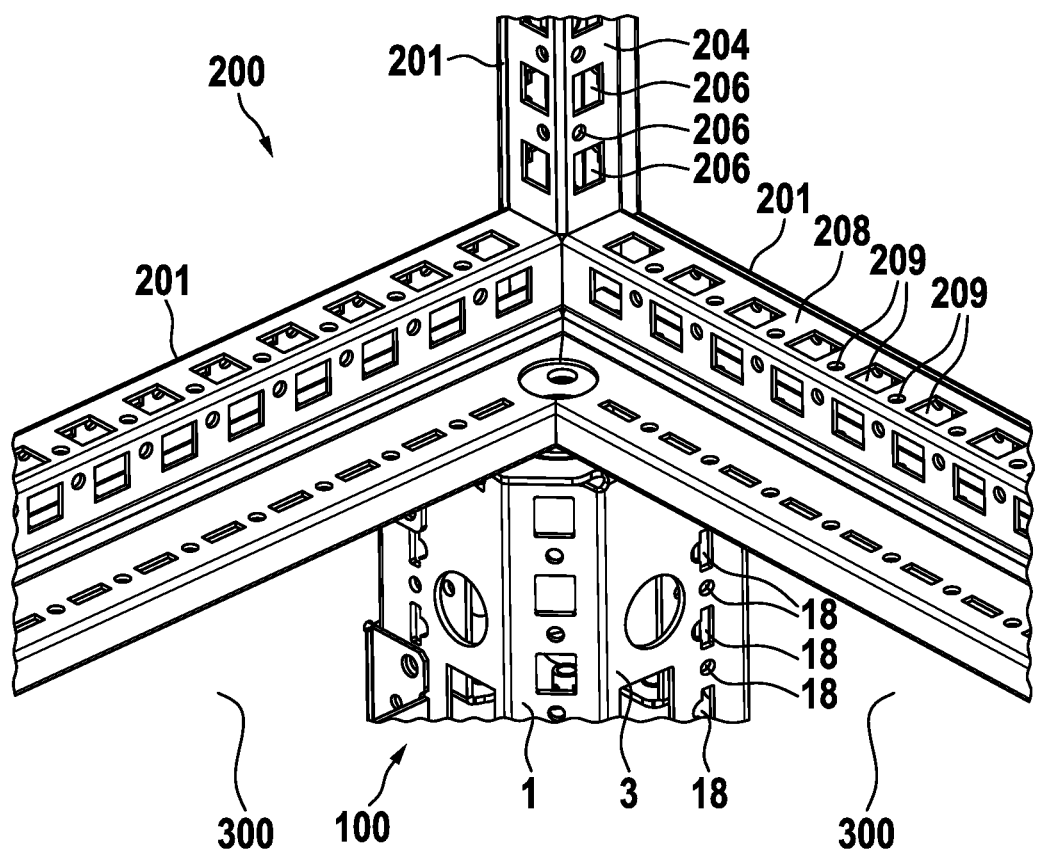
Figure 15:
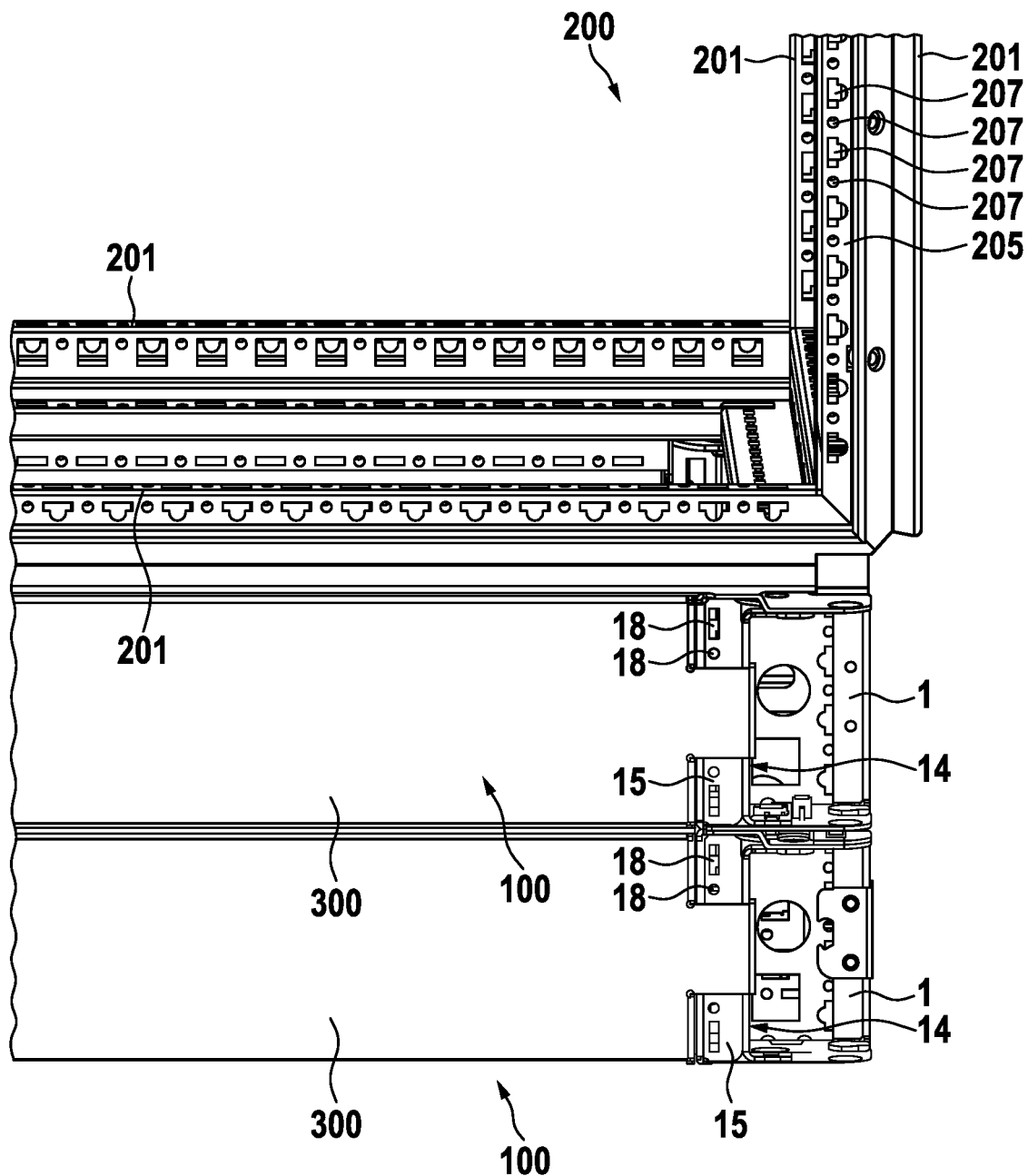
Figure 16:
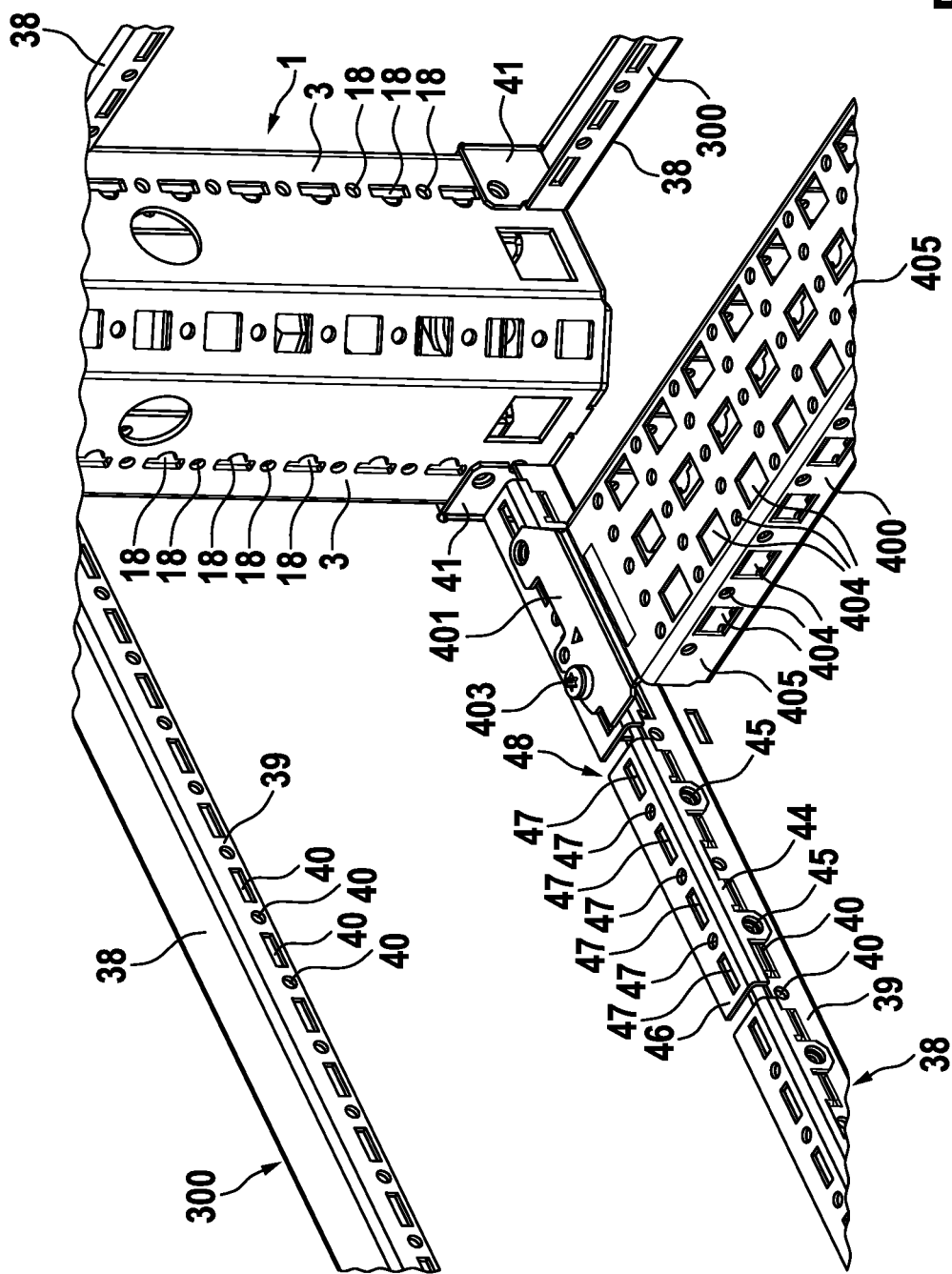

FIG. 7 a row arrangement of four shaped parts according to one embodiment of adjacent switch cabinet bases in perspective view;

FIG. 8 shows another embodiment of a shaped part of a base corner piece to which a levelling foot is attached, in perspective view;

FIG. 9 shows a shaped part of a base corner piece according to an embodiment to which a corner panel is fixed, in a cross-sectional view;

FIG. 10 shows a base arrangement for a row of switch cabinets;

FIG. 11 shows the depiction of FIG. 10 in the area of the connection between the adjacent switch cabinet bases, in a detailed view;

FIG. 12 shows an exemplary embodiment of an interior installation of a switch cabinet base;

FIG. 13 shows an arrangement according to the invention with a transport roller fixed to the base; and FIG. 14 shows a switch cabinet base with a frame rack placed thereon and a base corner piece according to another embodiment, in perspective view;

FIG. 15 shows a double switch cabinet base with a frame rack placed thereon according to another embodiment, in a side view; and FIG. 16 shows a switch cabinet base with a frame rack placed thereon and an interior installation component mounted to the base, in perspective view.

DETAILED DESCRIPTION

Example embodiments will now be described more fully with reference to the accompanying drawings.

Figure 1:
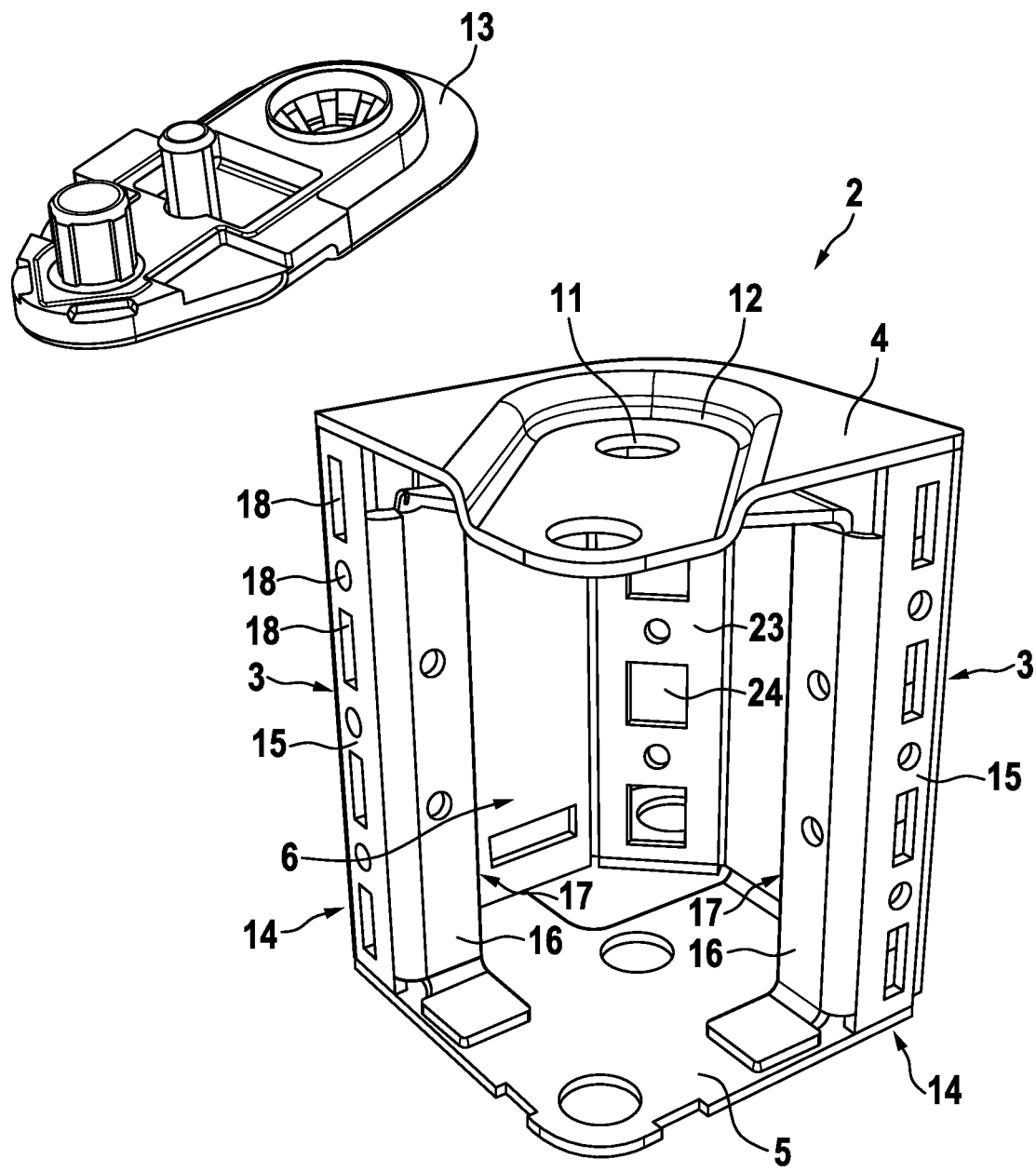
FIG. 1 shows a shaped part of a base corner piece as well as a sliding skid according to an embodiment in perspective view.

FIG. 1 shows an exemplary embodiment of a shaped part 2 for a base corner piece according to an embodiment of the invention. The shaped part 2 is formed as a sheet metal shaped part.

The sheet metal shaped part 2 essentially consists of a cover side 4, a bottom side 5 and two outer walls 3, which extend perpendicularly to the cover side 4 and the bottom side 5 and connect them to each other at a distance. The outer walls 3 are connected by a connecting side 23 which extends at an angle of 45° to the outer walls 3. The outer walls 3 and the connecting side 23 are integrally formed and the connecting side 23 has a perforation of regularly spaced rectangular openings 24.

The cover side 4 has a trough-shaped recess 12, into which a sliding skid 13 can be positively inserted. The sliding skid 13 can, for example, be pre-assembled on the underside of the frame rack of a switch cabinet, so that due to the form-fitting contours of the sliding skid 13 and the trough-shaped recess 12, the pre-positioning of the switch cabinet frame rack on the base corner piece, in particular on the cover side 4 of the sheet-metal shaped part 2, is made easier, so that it is possible to conveniently screw together the sheet metal shaped part 2 and the switch cabinet frame rack.

At the free ends facing away from the connecting side 23, the outer walls 3 each have an U-edging 14, with a first profile side 15 extending perpendicularly to the outer wall 3 and a second profile side 16 formed on the first profile side 15, which extends parallel to the outer wall 3 and has a free edge 17 arranged in the interior space 6 and spaced apart from the outer wall 3. The first profile side 15 has a system perforation 18 of regularly spaced rectangular and round openings. The second profile side 16 has further round holes, which can be used in particular for fixing base panels.

The sheet metal shaped part 2 can be obtained by punching, edging and welding a metal sheet, wherein the trough-shaped recess 12 can be formed, for example, in the course of an embossing process. The sheet metal shaped part 2 can thus be produced at low cost compared to injection-moulded base corner pieces known from the art.

Figure 2:
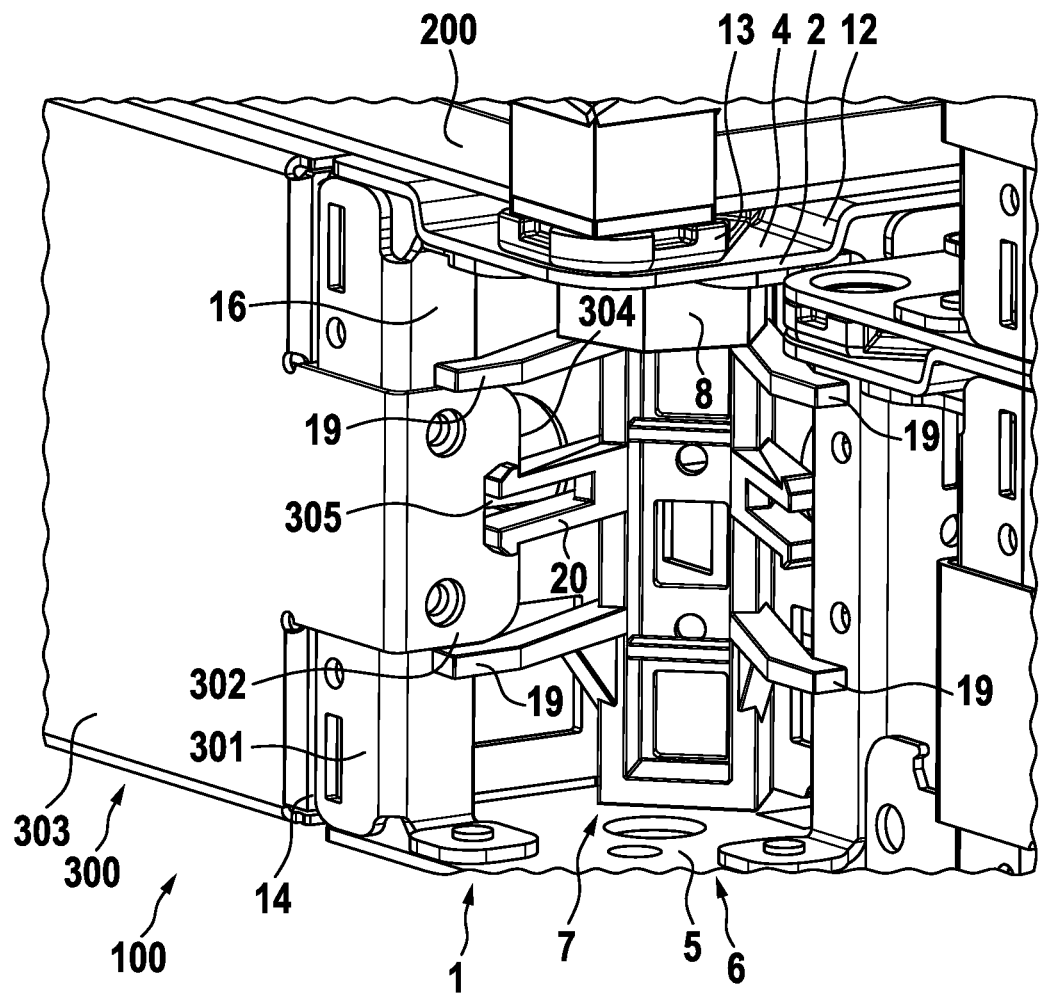
FIG. 2 shows a switch cabinet base with a frame rack placed thereon and a base corner piece according to another embodiment in perspective view.

Regarding the embodiment shown in FIG. 2, an inlay 7 is inserted into the interior space 6 of the shaped part 2, which extends over the complete distance between the cover side 4 and the bottom side 5 and, in particular in this dimension, can be positively accommodated between the cover side 4 and the bottom side 5, optionally in a press fit. Facing the cover side 4, the inlay 7 has a receptacle 8 for a threaded nut, in particular for a K-Lock nut. The shaped part 2 can be the same as described with reference to FIG. 1.

A frame rack 200 is placed on the cover side 4 and in the area of the recess 12 via a sliding skid 13 on the shaped part 2. A base panel 300 engages around one of the two U-edgings 14 with a fastening tab 301, wherein the inlay 7 has a first and a second pair of guide pins 19 arranged at a distance from one another, of which a first pair of guide pins 19 abuts with its free ends against the second profile side 16 of a first of the two U-edgings 14, and wherein a second pair of guide pins 19 abuts with its free ends against the second profile side 16 of a second of the two U-edgings 14. Furthermore, the inlay 7 has a first and a second pair of mutually pre-tensionable latch pawls 20 which each extend with their free ends between one of the pairs of guide pins 19 towards and parallel to the respective second profile side 16.

A base panel 300 engages around one of the two U-edgings 14 with its fastening tab 301, wherein a free end 302 of the fastening tab 301 extends perpendicularly to the panel front 303 and one of the U-edgings 14 rests against the second profile side 16. The free end 302 of the fastening tab 301 has an undercut clearance 305 on its edge 304 facing the interior space, into which the latching pawls 20 of the inlay 7, which can be pretensioned relative to one another, engage, so that the base panel 300 can be latchingly fixed onto the base corner piece 1.

If required, the second profile side 16 and the free end 302 of the fastening side 301 have flush openings which could be used to screw the base panel 300 to the shaped part 2 for an even more secure connection. When the base panel 300 is placed on the shaped part with the aid of the pair of guide pins 19, a preliminary alignment of the undercut clearance 305 on the mutually pre-tensionable latch pawls 20 is achieved when the panel and base corner piece 1 approach each other, so that when latch pawls 20 and clearance 305 meet, the two can engage in each other without offset.

Figure 3:
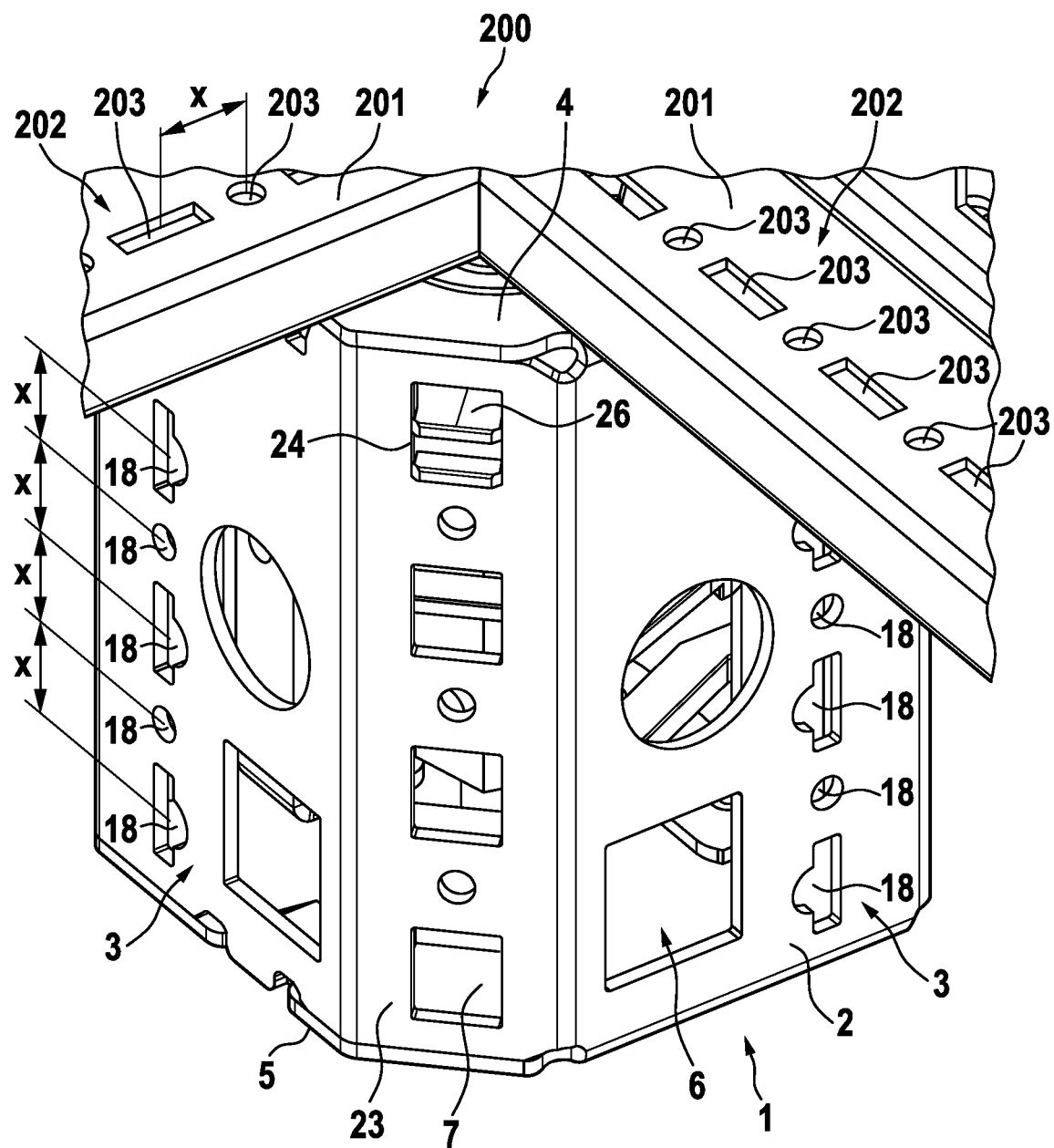
FIG. 3 shows an embodiment of an arrangement according to the invention with a base corner piece and a switch cabinet frame rack placed thereon with a view on the rear side of the shaped part, in perspective view.

FIG. 3 shows a view on the rear side of a shaped part 2 of embodiment of the invention with the switch cabinet frame rack 200 mounted thereon. Generally, the switch cabinet frame rack, especially the base assembly, can have a geometry as known from DE 10 2015 121 193 A1. The switch cabinet frame rack 200 has a plurality of profile struts 201, each of which has a first mounting side 202 with a row of holes of first mounting receptacles 203. The base corner piece 1 has a second mounting side 3 with a row of holes of second mounting receptacles 18, whereby the first and second mounting receptacles 18, 203 are spaced apart by the same grid dimension x.

As can be seen, the outer walls 3 are connected to each other via a connecting side 23, whereby the connecting side 23 extends at an angle of 45° to the outer walls 3. The connecting side 23 has a further system perforation of regularly spaced polygonal apertures 24. In the uppermost aperture 24, the inlay 7 engages with a positive-locking adapter formed on its rear side and facing the connecting side 23. In this way, the inlay 7 is accommodated in the interior space 6 of the shaped part 2 in a rotation-proof manner.

Figure 4:
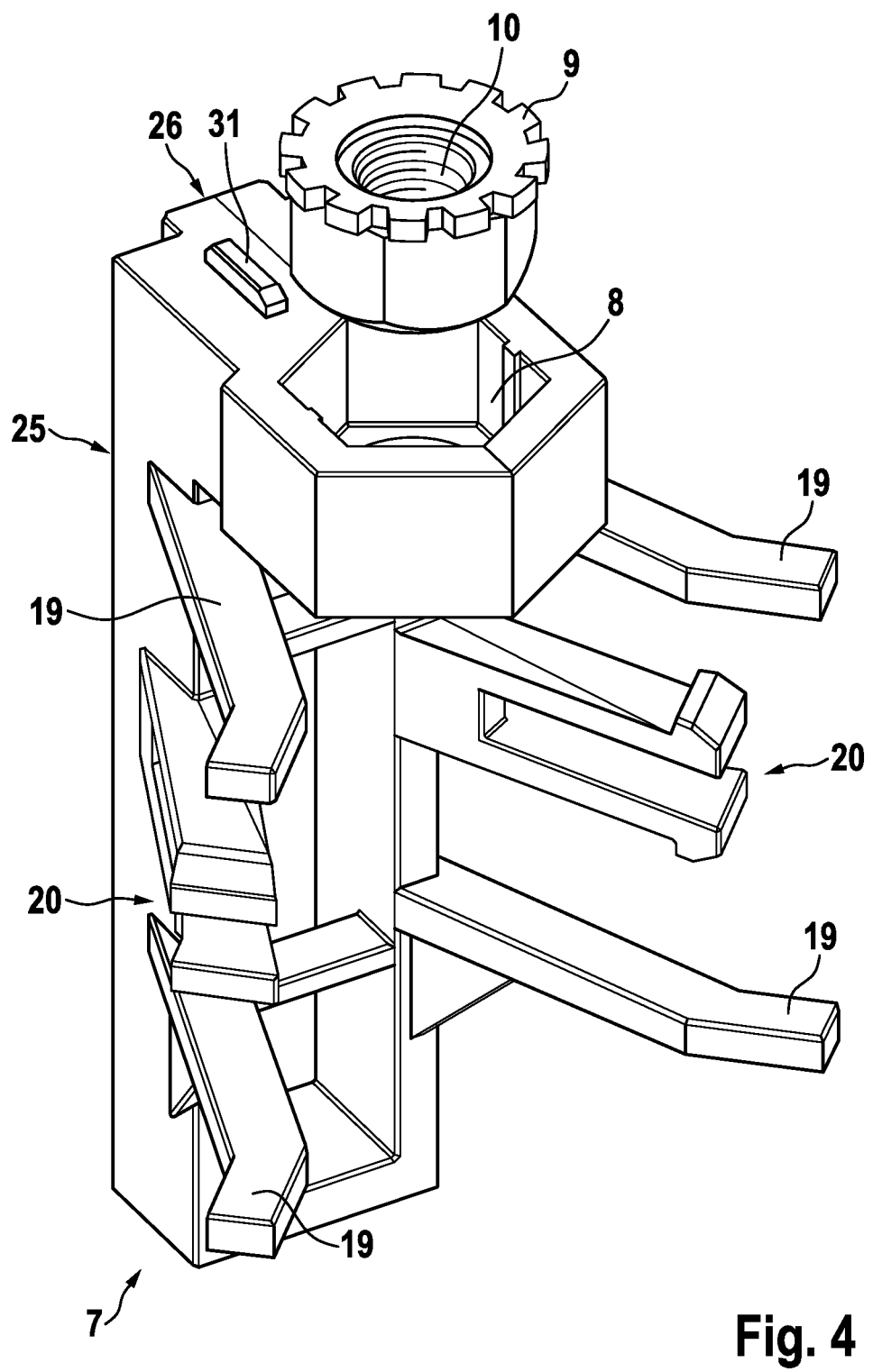
FIG. 4 shows an inlay for a base corner piece according to an embodiment in perspective view.

FIG. 4 shows a detailed perspective view of an exemplary inlay 7. Said inlay can be formed, for example, as an injection moulded part. As has been exemplarily described with reference to FIG. 3, the inlay 7 can have a positive locking adapter 26 on its rear side 25. A further positive locking adapter 31 can be formed at an upper end of the inlay, wherein the inlay 7 can engage via the further positive locking adapter 31 into a receptacle in the cover side 4 of the shaped part (not shown) in order to achieve a supplementary rotation protection of the inlay 7 inside the shaped part.

Further, the inlay 7 has a receptacle 8 open towards the top side of the inlay 7, i.e. towards the cover side 4 of a shaped part, into which a threaded nut 9 with an internal thread 10 is inserted. The threaded nut 9 can in particular be formed as a K-Lock nut.

As already described with reference to FIG. 2, the inlay 7 may have in addition to a first and a second pair of guide pins 19 a first and a second fastening means 20, the latter in this case consisting of a pair of latch pawls which can be pre-tensioned against each other. While a pair of guide pins 19 are each provided to pre-align between them a fastening tab of a base panel with respect to the fastening means 20 when the base panel is guided towards the corner piece to secure the base panel to the corner piece, the fastening means 20 with their end latching pawls are adapted to engage in an clearance in an edge of the fastening tab facing the interior space of the base corner piece and thereby fix the base panel to the respective base corner piece.

Figure 5:
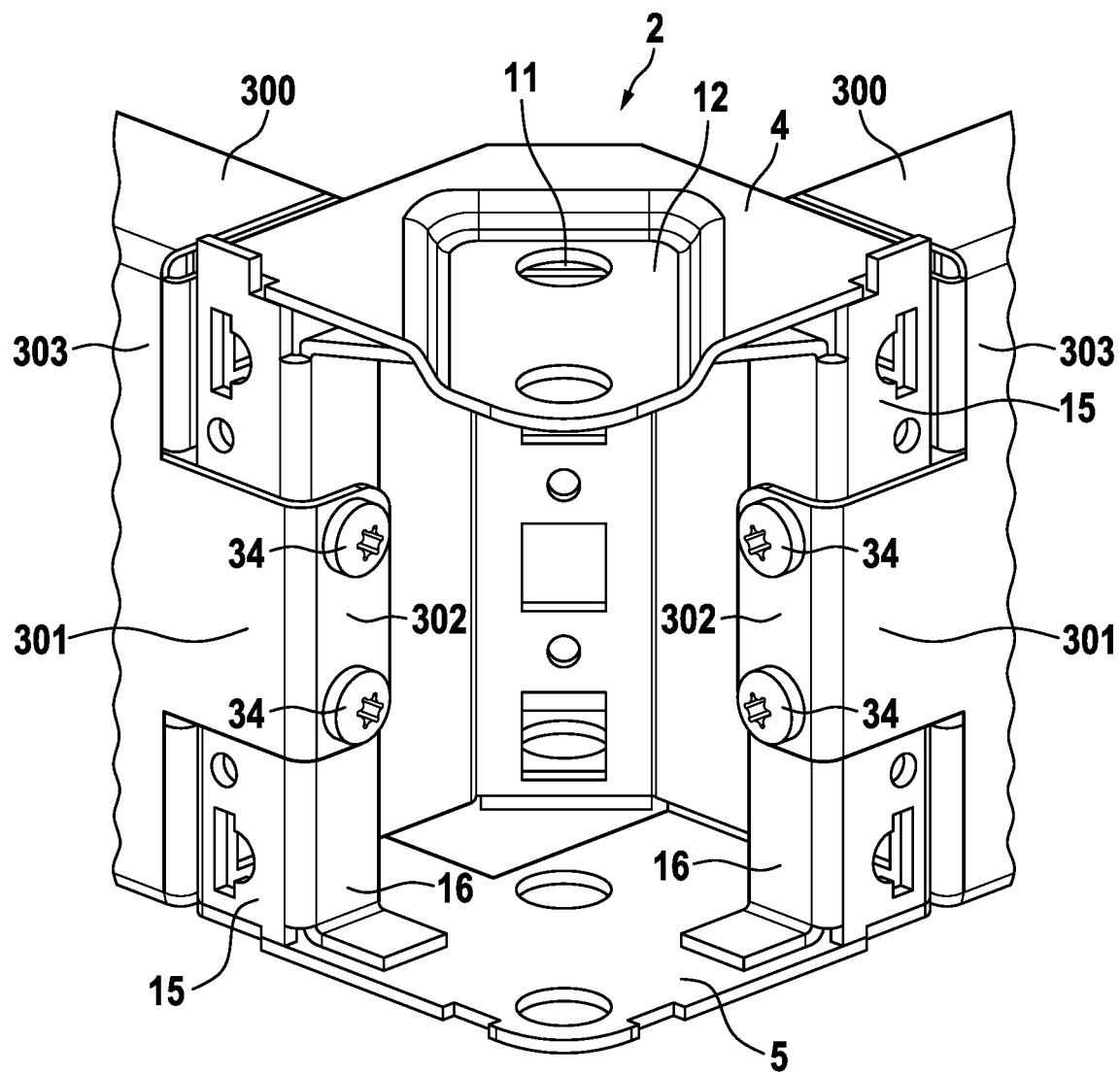
FIG. 5 shows a shaped part of a base corner piece according to an embodiment, to which two base panels are fixed according to a first fastening variant, in perspective view.
Figure 6:
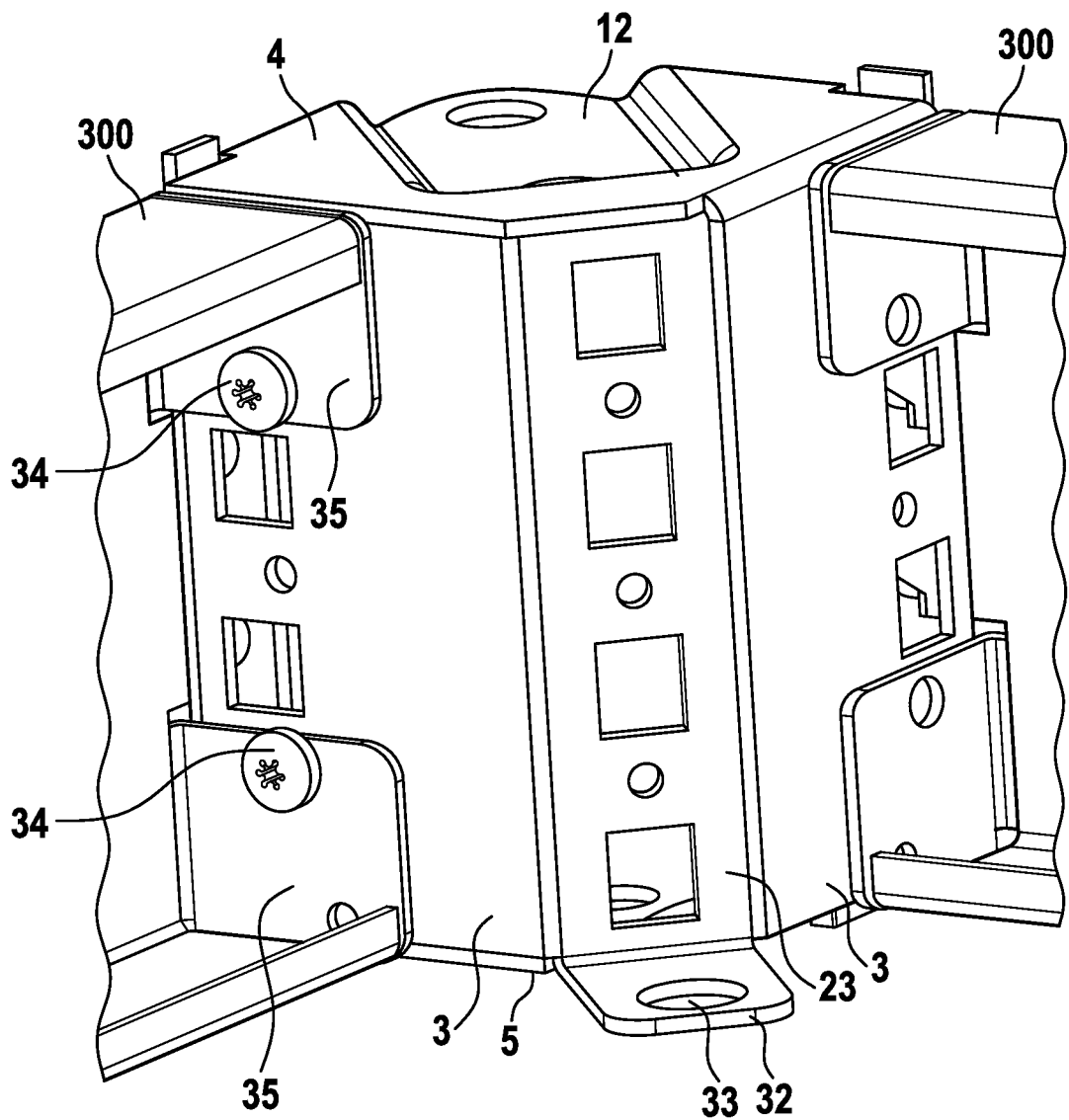
FIG. 6 shows a shaped part of a base corner piece according to an embodiment, to which two base panels are fixed according to a second fastening variant, in perspective view.

FIGS. 5 and 6 show two further embodiments for mounting a base panel 300 to a shaped part 2 of a base corner piece according to the invention. Whereas in the embodiment shown in FIG. 5, the base panel 300 is screwed via the free ends 302 of its fastening tab 301 to the second profile side 16 of an U-edging 14 of the shaped part 2, in the embodiment shown in FIG. 6, the base panels 300 are screwed directly to the outer walls 3, for which purpose the base panels 300 have mounting flanges 35, each with at least one bolt opening, via which the base panel 300 can be fixed to the outer walls 3 with two screw bolts 34. A mounting tab 32 with a hole 33 extends perpendicular to the connecting side 23 in the direction of the interior space enclosed by the switch cabinet base, with the aid of which hole the base corner piece, in particular the shaped part 2 of it, can be screwed to a support as required.

FIG. 7 shows a row arrangement in which two variants are illustrated for fastening adjoining base corner pieces, in particular shaped parts 2 of adjacent switch cabinet base frames. While on the one hand a row connector 36 connects the adjoining shaped parts 2 with each other via their parallel outer walls 3 by respective screw connections being made between the row connector 36 and the outer side 3 of both shaped parts 2, on the other hand a base panel 300 is used for the row arrangement of two shaped parts 2 in the front pairing of two shaped parts 2 shown in FIG. 7. The free end 302 or the fastening tab 301, respectively, can have a width which is perpendicular to the longitudinal direction of the base panel 300 and which corresponds to a nominal distance between the two adjoining shaped parts 2 in the row arrangement, so that these can be precisely pre-positioned relative to one another via the base panel 300, in particular in such a way that screw bolt connections 34 can be made between the two shaped parts 2 and the base panel 300.

FIG. 8 shows a base corner piece 1 with a levelling foot accommodated inside the base corner piece 1, which has a threaded bolt 27 which extends between the cover side 4 and the bottom side 5 of the base corner piece 1 and through the cover side 4. The levelling foot also has a levelling sleeve 28 which is screwed onto the threaded bolt 27 and is located between the cover side 4 and the bottom side 5. A levelling base 30 is formed on the levelling sleeve 28 at the end facing the bottom side 5, which extends through the bottom side 5. The threaded bolt 27 may have at one free end (not shown) with which it passes through the cover side a lock nut (not shown) which is accessible through the frame rack 200 via which the levelling foot can be fixed relative to the frame rack 200 or relative to the cover side 4, respectively, in a levelling position set via the levelling sleeve 28.

FIG. 9 shows an exemplary embodiment for the fastening of a base corner panel 21 to a shaped part 2 of a base corner piece according to the invention. As can be seen, the interior space 6 of the base corner piece 1 is closed by the corner panel 21, wherein the corner panel 21 rests parallel on the first profile side 15 of the U-edgings 14 and engages with a latching hook 22 on one of the free edges 17 of each of the two second profile sides. The latching hooks 22 extend parallel to each other and each at a 45° angle to the side of the corner panel 21 on which they are formed. The corner panel 21 essentially consists of two integrally formed partial wall sections extending perpendicularly to one another, a first of the two latching hooks 22 extending at a 45° angle to a first of the two partial wall sections and a second of the two latching hooks 22 extending at a 45° angle to a second of the two partial wall sections.

FIGS. 10 and 11 show an arrangement of two connected switch cabinet bases 100. The switch cabinet bases essentially consist of four base corner pieces 1, which are arranged at the four corners of the respective base 100 and connected to each other via base panels 300. It can be seen that the first base panels 300 in vertical direction each connect two opposing base corner pieces of the same switch cabinet base 100 with each other and thus provide the classic covering function of the switch cabinet base. At the transition between the two switch cabinet bases 100, a further, identical base panel 300 is used to connect the two bases 100 with each other. For this purpose, the base panel 300, which connects the adjoining bases 100 with each other via the opposite corner pieces 1, is aligned horizontally, wherein its front side faces the support of the switch cabinet base 100, and wherein on the rear side of the base panel 300 a further U-edging 38 is formed, the free mounting side 39 of which has a system perforation 40 consisting of regularly spaced mounting receptacles 40. The mounting receptacles 40 can also be arranged in adherence to the grid dimension. A fastening bracket 600 is fixed to the horizontally aligned base panel 300 via the mounting sides 39, wherein the fastening bracket 600 in turn serves to fasten a cable catch rail 29. A further cable catch rail 29 is fixed directly to one of the base corner pieces 1.

Two further fastening brackets 600, which may be identical to the already mentioned fastening bracket 600 for fixing the cable catch rail, are used to provide a mounting plane for bottom sheets in order to provide a closure of the switch cabinet interior extended downwards by the volume of the switch cabinet base.

FIG. 12 shows another embodiment of a switch cabinet base 100, in which the four corner pieces 1 arranged in the corners of the switch cabinet base are connected to each other via four base panels 300 to form a rectangular base frame. In this case, however, the base panels are aligned horizontally and facing the support of the base 100 with their front side. On the shown rear side, the base panels 300 each have a second U-edging 38 on their opposite longitudinal edges, wherein the U-edgings 38 have a mounting side 39 with mounting receptacles spaced apart from the front side of the base panel 300.

It can be seen that an interior installation component 400, in particular a mounting chassis, is guided between two opposing base panels 300 and is fixed with a fastening section 401 to the second U-edging 38, in particular to the respective free mounting side 39 of said U-edging 38. The two rows of holes in the mounting receptacles 39, via which the interior installation component 400 is fixed via its opposite fastening sections 401 to the opposite base panels 300, have a distance to each other which corresponds to an integral multiple of the grid dimension. As a result, the interior installation component 400 can be a conventional interior installation component that can be used, for example, for the interior installation of the switch cabinet, so that no special interior installation components with special fastening means are required for installation in the switch cabinet base 100.

FIG. 13 shows a switch cabinet base 100 with a transport roller 37 attached to a corner piece 1. In particular, the transport roller has a fastening wedge 42, by means of which the transport roller 37 is fastened to the corner piece 1, and which at its end remote from the corner piece 1 has a swivel bearing, by means of which a roller support 43 can be swivelled about a swivel axis y relative to the fastening wedge. A roller is fixed via a horizontal bearing to the underside of the roller support 43 facing the support of the switch cabinet base 100. The transport roller 37 can be swivelled between a transport position and a storage position, wherein in the storage position a support plane of the transport roller 37 lies in a support plane of the base corner piece or above and wherein in the transport position the support plane of the transport roller lies below the support plane of the base corner piece. In order to move the transport roller between the two mentioned positions, it can be swivelled around the swivel axis y as required.

FIG. 14 shows in perspective view a another arrangement according to the invention consisting of a switch cabinet base 100 with a switch cabinet frame rack 200 mounted thereon, whereby the arrangement is shown in the corner area with a view of the central corner piece 1, on which two base panels 300 are fixed, which extend at an angle of 90° to each other. Corner piece 1 is essentially identical to the corner piece shown in FIG. 3. Correspondingly, corner piece 1 has on an outer wall 3 a system perforation 18 of mounting receptacles spaced regularly and by a grid dimension.

A vertical strut 201 of the frame rack 200 has a profile side 201 facing towards the interior space of the volume enclosed by the frame rack 200 with further mounting receptacles 206, which also forms a system perforation of mounting receptacles 206 spaced regularly and by the same grid dimension.

The profile side 204 and the outer wall 3 extend parallel to each other, as do the system perforations 18 and 206. The outer wall 3 and the profile side 204 have a vertical distance to each other, which also corresponds to a multiple of the grid dimension. This ensures, for example, that a mounting plane of an interior installation component, for example the mounting plane of a mounting chassis, which is fixed to the corner piece 1 via system perforation 18, has a distance to the profile side 204 and the system perforation formed therein of mounting receptacles 206 which also corresponds to an integer multiple of the grid dimension. Any mounting receptacles formed in the mounting chassis can also be arranged in relation to the mounting receptacles 206 while adhering to the grid dimension, so that the grid dimension between the switch cabinet volume enclosed by the frame rack 200 and the base volume enclosed by the base 100 is retained throughout, so that the base area is fully suitable for the interior installation of the switch cabinet.

FIG. 15 shows an arrangement of a switch cabinet frame rack 200 arranged on two stacked switch cabinet bases 1. The corner pieces 1 of the switch cabinet bases 100 can in turn be formed according to FIG. 1 or FIG. 3 and accordingly have a first U-edging 14 with a system perforation 18 on the first profile side 15. The system perforation 18 of the first profile side 15 extends vertically, whereby the mounting receptacles of the system perforation 18 are arranged under the grid dimension. Likewise, the front vertical profile 201 of the frame rack 200 in the illustration, which extends above the two base corner pieces 1, has on one profile side 205 a vertically extending system perforation of mounting receptacles 207, which are also arranged under the grid dimension. Furthermore, the profile side 205 and the first profile side 15 are arranged in the same plane, so that the mounting receptacles 18 of the first profile side 15 and the other mounting receptacles 207 of the profile side 205 are located in the same mounting plane. Within this mounting plane, the two parallel system perforations of mounting receptacles 18 and mounting receptacles 207 are spaced apart by an integer multiple of the grid dimension.

FIG. 16 shows another arrangement in which a mounting bracket 48 is fixed via the free mounting side 39 of the second U-edgings 38 of the base panel 300. The mounting bracket 48 has a fastening side 44 and a vertical mounting side 46. The mounting bracket 48 can be fixed to the free mounting side 39 via the fastening side 44. For this purpose, the fastening side 44 has mounting receptacles 45, through which, for example, bolts can be screwed through the fastening side 44 and the free mounting side 39.

The mounting side 46 has a system perforation of regularly spaced mounting receptacles 47, wherein the mounting receptacles 47 are spaced apart from each other under the grid dimension and are furthermore arranged in the grid dimension of the further mounting receptacles 40 of the free mounting side 39, so that the mounting receptacles 47 of the mounting side 46 are arranged in the grid dimension of the whole system. An interior installation component 400, here a mounting chassis, is fixed to the base panel 400 via the mounting side 46. For this purpose, the interior installation component 400 has a first fastening section 401 and an opposite second fastening section (not shown). The shown first fastening section 401 is screwed to the base panel via the mounting side 46. For this purpose, the interior installation component 400 has a fastening means 403, here a threaded bolt.

Due to the arrangement of the mounting bracket 48 on the second U-edging 38 of the base panel 300 with grid dimensions, the further mounting receptacles 404 on the mounting sides 405 of the mounting chassis 400 are also arranged in the grid dimensions of the whole system.

The features of the invention disclosed in the above description, in the drawings and in the claims may be essential for the realisation of the invention, either individually or in any combination.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A switch cabinet assembly comprising:
   a switch cabinet base and a switch cabinet frame rack mounted thereon;
   wherein:
   the switch cabinet base includes a plurality of base corner pieces fixed to the switch cabinet frame rack;
   the switch cabinet frame rack includes a plurality of profile struts, at least one profile strut of which comprises a first mounting side with a row of holes of first mounting receptacles;
   at least one of the base corner pieces comprises a second mounting side with a row of holes of second mounting receptacles, the first and second mounting receptacles are spaced apart by the same grid dimension; and
   the row of holes of the second mounting receptacles extends vertically.

2. The switch cabinet assembly according to claim 1, in which at least one of the following conditions is met:
   a. the first and the second mounting side are arranged in the same plane;
   b. the first mounting receptacles form a first system perforation of mounting receptacles regularly spaced apart by the grid dimension and the second mounting receptacles form a second system perforation of mounting receptacles regularly spaced apart by the grid dimension;
   c. the first mounting receptacles form a first row of holes of mounting receptacles regularly spaced apart by the grid dimension and the second mounting receptacles form a second row of holes of mounting receptacles regularly spaced apart by the grid dimension, wherein the two rows of holes are spaced apart from each other by the grid dimension or an integer multiple of the grid dimension.

3. The switch cabinet assembly according to claim 1, which further comprises an interior installation component, which
   a. is fixed with a first fastening section in a volume enclosed by the switch cabinet frame rack and with a second fastening section in a volume enclosed by the switch cabinet base, or
   b. is mounted with a first fastening section via one of the first mounting receptacles on the first mounting side of the profile strut, and which is fixed with a second fastening section via one of the second mounting receptacles on the second mounting side of the base corner piece, or
   c. is fixed with a first fastening section via one of the second mounting receptacles to the second mounting side of the base corner piece, and which is fixed with a second fastening section via one of the second mounting receptacles to the second mounting side of another of the base corner pieces, wherein the two rows of holes of the second mounting receptacles of the corner pieces have a distance to each other which corresponds to an integer multiple of the grid dimension.

4. The switch cabinet assembly according to claim 3, in which the first fastening section of the interior installation component has a first fastening means and the second fastening section of the interior installation component has a second fastening means, wherein the fastening means comprise a distance which is an integer multiple of the grid dimension to each other.

5. The switch cabinet assembly according to claim 1, in which two of the base corner pieces of the switch cabinet base are each arranged facing each other with an outer wall, wherein the outer walls each comprise the second mounting side comprising the second mounting receptacles, and wherein the outer walls are arranged at a distance from each other which corresponds to an integer multiple of the grid dimension.

6. The switch cabinet assembly according to claim 1, in which each one of the plurality of base corner pieces includes a sheet metal shaped part, which has a first and a second outer wall which extend perpendicular to each other, and which further has an upper cover side and a lower bottom side which are arranged parallel to each other and perpendicular to the outer walls, wherein the outer walls, the cover side and the bottom side delimit an interior space of the base corner piece which is open towards a corner of the sheet metal shaped part.

7. The switch cabinet assembly according to claim 6, in which each one of the plurality of base corner pieces includes a plastic inlay, which extends in the interior space between the cover side and the bottom side and which at its end in front of the cover side has a receptacle which is open towards the cover side, in which receptacle a threaded nut is accommodated in a rotation-proof manner.

8. The switch cabinet assembly according to claim 7, in which the plastic inlay is releasably connected to the sheet metal shaped part in a mounting position in the interior space.

9. The switch cabinet assembly according to claim 6, in which a threaded passage of a threaded nut is aligned with an opening through the cover side and accessible via the opening.

10. The switch cabinet assembly according to claim 6, in which the cover side has a trough-shaped recess for the positive reception of a sliding skid, wherein an opening through the cover side is arranged in the recess, which is aligned with a threaded passage of a threaded nut.

11. The switch cabinet assembly according to claim 6, in which the outer walls each have a first U-edging at their free longitudinal edge, with a first profile side extending perpendicularly to the outer wall and a second profile side formed on the first profile side, which extends parallel to the outer wall and has a free edge arranged in the interior space.

12. The switch cabinet assembly according to claim 11, in which the first U-edgings comprises the second mounting side on at least one of the first and second profile side.

13. The switch cabinet assembly according to claim 11, in which an inlay has a first and a second pair of guide pins spaced apart, the first pair of guide pins with its free ends abutting the second profile side of a first one of the two U-edgings, and wherein the second pair of guide pins with its free ends abutting the second profile side of a second of the U-edgings.

14. The switch cabinet assembly according to claim 13, in which the inlay also has a first and a second pair of latching pawls pre-tensionable against each other, and which extends with its free end between one of the pairs of guide pins each towards and parallel to the respective second profile side.

15. The switch cabinet assembly according to claim 11, in which a base panel can engage around one of the two U-edgings with a fastening tab, wherein a free end of the fastening tab extends perpendicularly to the panel front, abuts against the second profile side of one of the first U-edgings and is fixed to the second profile side.

16. The switch cabinet assembly according to claim 15, in which the free end of the fastening tab has an undercut clearance on an edge facing the interior space, in which undercut clearance a pair of latching pawls engages.

17. The switch cabinet assembly according to claim 11, in which the interior space of the base corner piece is closed off by a corner panel which abuts parallel to the first profile sides of the first U-edgings and engages one of the two free edges of each of the two second profile sides with a latching hook.

18. The switch cabinet assembly according to claim 11, in which the two first profile sides of the first U-edgings and the two second profile sides of the first U-edgings are aligned perpendicular to each other.

19. The switch cabinet assembly according to claim 1, wherein the cabinet base includes outer walls connected to each other via a connecting side of a shaped part, wherein the connecting side has a polygonal aperture into which an inlay engages with a positive locking adapter formed on its rear side and facing the connecting side.

20. The switch cabinet assembly according to claim 1, wherein the cabinet base includes a threaded bolt extending between a cover side and a bottom side as well as through the cover side, with a levelling sleeve screwed onto the threaded bolt and arranged between the cover side and the bottom side and on which a levelling base is formed which extends through the bottom side.

21. The switch cabinet assembly according to claim 1, wherein the cabinet base includes a shaped part, and a transport roller swivelable between a transport position and a storage position, wherein, in the storage position, a support plane of the transport roller lies in or above a support plane of the base corner piece and wherein, in the transport position, the support plane of the transport roller lies below the support plane of the base corner piece.

22. The switch cabinet assembly according to claim 1, in which a base panel of the switch cabinet base has a second U-edging on opposite longitudinal edges each, wherein the second U-edgings have a free mounting side each which can be arranged on a rear side of the base panel parallel to a front side of the base panel and in a common plane, wherein the free mounting sides each have a row of holes of further mounting receptacles, and wherein the rows of holes run parallel to each other and have a distance to each other that corresponds to an integer multiple of the grid dimension.

23. The switch cabinet assembly according to claim 22, in which the switch cabinet base has two of the base panels which are arranged opposite each other with their second U-edgings facing each other, wherein a bottom sheet is fixed to and extending between the two base panels via a pair of opposing free mounting sides of the second U-edgings of the two base panels, wherein a support and a fastening plane for the bottom sheet are provided via a fastening bracket fixed to the base panels.

24. The switch cabinet assembly according to claim 1, in which a base panel of the switch cabinet base is an anti-tilt protection for the assembly by mounting the base panel between adjacent base corner pieces in a horizontal orientation, in which the base panel rests with its front or rear side on a support on which the assembly rests and with a longitudinal edge projects beyond the clear outer dimension of the frame rack and any flat parts mounted thereon.

25. A switch cabinet row consisting of at least two of the switch cabinet assemblies according to claim 1, in which two pairs of facing base corner pieces of adjacent switch cabinet bases, arranged at a distance from each other in the depth direction of the switch cabinet row, are connected to each other via a first base panel running in depth direction.

26. The switch cabinet row according to claim 25, in which the first base panel is aligned horizontally and its front faces the support on which the switch cabinet row stands.

27. The switch cabinet row according to claim 25, in which the switch cabinet row has a second base panel identical to the first base panel, which is vertically aligned and extends between two base corner pieces of the same switch cabinet base.

28. The switch cabinet row according to claim 25, in which the first base panel has a second U-edging each along its two longitudinal edges with a free mounting side each, which runs parallel to the front side at a distance from a front side of the base panel at a rear side of the base panel and has a row of holes of further mounting receptacles in its direction of extension, wherein the rows of holes run parallel to each other and have a distance to each other that corresponds to an integer multiple of the grid dimension.

29. The switch cabinet row according to claim 27, in which the first and second base panels are identically formed and have a second U-edging each along their two longitudinal edges, wherein in each case a mounting flange is formed on the second U-edgings which extends perpendicularly to all three profile sides of the second U-edging.

30. The switch cabinet row according to claim 29, in which one of the switch cabinet bases has a first base panel on opposite sides each, the base panels each having a row of system perforations on mutually facing longitudinal edges which run parallel to one another and are spaced apart by a distance corresponding to an integral multiple of the grid dimension, and wherein an interior installation component, such as a cable catch rail or a mounting chassis, extends between the longitudinal edges and is fixed to the rows of system perforations with opposing fastening sections.

* * * * *